United States Patent
Okai et al.

(10) Patent No.: US 8,377,216 B2
(45) Date of Patent: Feb. 19, 2013

(54) VACUUM PROCESSING APPARATUS AND VACUUM PROCESSING METHOD

(75) Inventors: Masakazu Okai, Shunan (JP); Kenji Tamai, Kudamatsu (JP); Toru Ueno, Shunan (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/846,323

(22) Filed: Jul. 29, 2010

(65) Prior Publication Data

US 2011/0265813 A1    Nov. 3, 2011

(30) Foreign Application Priority Data

Apr. 28, 2010    (JP) .................... 2010-102861

(51) Int. Cl.
*B08B 7/00*    (2006.01)
(52) U.S. Cl. .............. 134/1.1; 134/1.2; 134/18; 134/26; 134/28; 134/30; 134/31; 134/34; 134/36; 134/37; 134/41; 134/42; 134/902
(58) Field of Classification Search ............ 134/1.1, 134/1.2, 18, 26, 28, 30, 31, 34, 36, 37, 41, 134/42, 902
See application file for complete search history.

(56) References Cited

U.S. PATENT DOCUMENTS

| 5,007,981 | A | 4/1991 | Kawasaki et al. |
| 6,491,832 | B2 | 12/2002 | Yoshioka et al. |
| 7,627,785 | B1 * | 12/2009 | Grodnik et al. ............ 714/38.14 |
| 2007/0131245 | A1 * | 6/2007 | Nakayama ..................... 134/1.1 |

FOREIGN PATENT DOCUMENTS

| JP | 2-224233 | 9/1990 |
| JP | 6-84840 | 3/1994 |
| JP | 2001-110663 | 4/2001 |

\* cited by examiner

*Primary Examiner* — Bibi Carrillo
(74) *Attorney, Agent, or Firm* — Antonelli, Terry, Stout & Kraus, LLP

(57) ABSTRACT

A vacuum processing apparatus includes a vacuum chamber for performing a plasma process and a cleaning process unit for performing a cleaning process to apply a plasma process to a wafer on which a single layer or a laminated film containing a metallic film is formed by using a corrosive gas, and a control unit having a sequence to abort the plasma process when an abnormality occurs in the vacuum chamber and transfer the wafer subjecting to the aborting of the plasma process to the cleaning process unit, after elapsing a predetermined time, to perform the cleaning process.

6 Claims, 5 Drawing Sheets

VACUUM PROCESSING APPARATUS AND VACUUM PROCESSING METHOD

INCORPORATION BY REFERENCE

The present application claims priority from Japanese application JP2010-102861 filed on Apr. 28, 2010, the content of which is hereby incorporated by reference into this application.

BACKGROUND OF THE INVENTION

The present invention relates to a vacuum processing apparatus having a vacuum chamber and cleaning device for performing a cleaning process and a vacuum processing method of performing the cleaning process in accordance with a control sequence when an abnormality occurs in the vacuum processing apparatus.

Normally, a conducting film containing Al is etched by using a halogen-based gas such as $Cl_2$, $BCl_3$, etc. to thereby remain a chlorine-based residue on the conducting film even after removing a resist film, in consequence, a corrosion occurs. JP-A-6-84840 discloses an inhibiting method of causing a corrosion, in which a mixed gas with $O_2$ and $CF_4$ is used to convert aluminum halide into soluble aluminum fluoride when applying an ashing process to the resist film, and the aluminum fluoride can then be removed by washing with water after removing the resist film. Further, JP-A-2-224233 (corresponding to U.S. Pat. No. 5,007,981) discloses a processing apparatus providing an etching device, an ashing device, a cleaning device and a drying device.

Even when etching a high-dielectric material such as $Al_2O_3$, $HfO_3$ and $Ta_2O_3$, a ferroelectric material such as PZT (lead zirconium titanate), PLZT (lead lanthanum zirconium titanate), BST (barium strontium titanate), SBT (strontium bismuth tantalate), etc. by using the halogen-based gas such as chlorine base, the corrosion occurs at wirings made up of a laminated film containing the ferroelectric material if the cleaning process is not applied to the material after etching it by using the halogen-based gas such as chlorine base, likewise to the etching process applied to the conducting film containing the above-mentioned Al. Further, JPA-2001-110663 (corresponding to U.S. Pat. No. 6,491,832) discloses a sample processing method and its apparatus in which a post-process step for removing a corrosion product is eliminated and it is enough that an anticorrosion treatment is applied to a residual chloride component by using plasma, and a manufacturing method of magnetic head.

As described above, the cleaning process is applied to the material, after the etching and ashing processes, to thereby remove the residual chlorine-based gas and to be able to prevent a metallic film from the corrosion, when the vacuum chamber operates in normality. However, when occurring a serious abnormality (or error) which cannot carry on the operation during the etching or ashing process in the vacuum chamber, a processing sequence for a wafer is aborted. Thereafter, an appropriate process (etching, ashing or cleaning process) is applied to the wafer after repairing the serious abnormality by an operator.

When occurring a light abnormality (or error) which can carry on the operation during the etching or ashing process in the vacuum chamber, the vacuum chamber holds and waits for a retry operation of wafer process instructed by the operator. The operator takes action for the light abnormality and manipulates the retry operation of wafer process to then carry on the processing sequence of the wafer.

SUMMARY OF THE INVENTION

In related arts, the cleaning process is applied to the metallic film after the etching and ashing processes to remove the residual corrosive gas on the wafer and to be able to prevent and inhibit the corrosion of the metallic film formed on the wafer, when the vacuum chamber operates in normality. However, when occurring an abnormality (or error) which cannot carry on the operation during the process in the vacuum chamber, the process halts without change. In this case, it has not considered that the corrosion of metallic film formed on the wafer proceeds caused by leaving for a long time during which the processing operation for the wafer is absent by the operator, since the cleaning process is not performed in a cleaning process chamber.

Further, even when occurring an abnormality (or error) which can carry on the operation in the vacuum chamber, it has also not considered that the corrosion of metallic film formed on the wafer proceeds caused by leaving for the long time during which the wafer process is waited for the retry operation by the operator, after occurring the abnormality (or error).

An object of the invention is to provide a vacuum processing apparatus and a vacuum processing method capable of preventing and inhibiting the corrosion of metallic film formed on the wafer by applying a cleaning process to the metallic film when occurring an abnormality in a vacuum chamber.

According to an aspect of the invention, a vacuum processing apparatus includes a vacuum chamber for performing a plasma process and a cleaning process unit for performing a cleaning process to apply a plasma process to a wafer on which a single layer or a laminated film containing a metallic film is formed by using a corrosive gas, and a control unit having a sequence to abort the plasma process when an abnormality occurs in the vacuum chamber and transfer the wafer subjecting to the aborting of the plasma process to the cleaning process unit to perform the cleaning process after elapsing a predetermined time.

According to the invention, the cleaning process is applied to the metallic film, when an abnormality occurs in the vacuum chamber, to thereby prevent or inhibit the corrosion of metallic film formed on the wafer.

The other objects, features and advantages of the invention will become apparent from the following description of the embodiments of the invention taken in conjunction with the accompanying drawings.

DETAILED DESCRIPTION OF THE EMBODIMENT

Hereinafter, an embodiment of the invention will be described with reference to FIG. 1 to FIG. 5.

Figure 1:
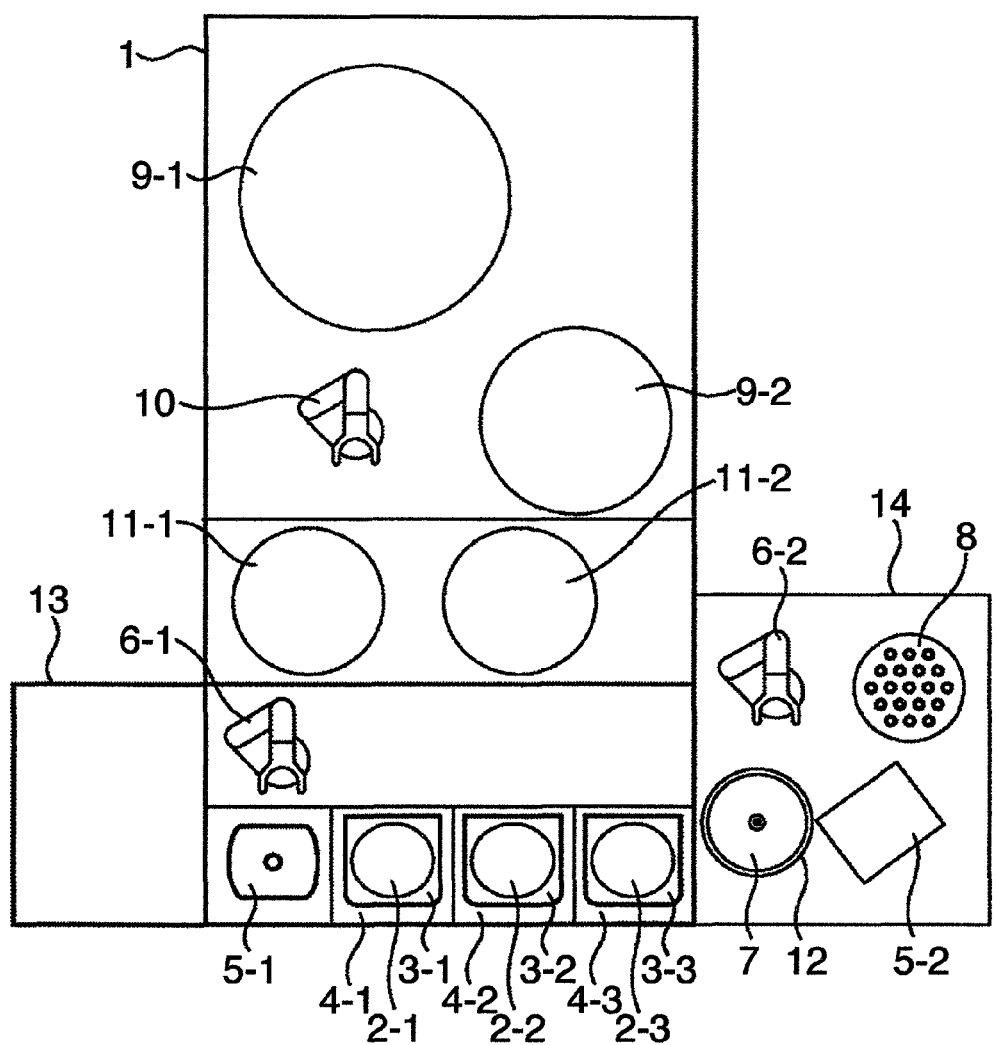
FIG. 1 is a schematic configuration diagram showing a vacuum processing apparatus in an embodiment of the invention.

FIG. 1 is an explanatory diagram for a vacuum processing apparatus in relation to the embodiment of the invention, and shows an apparatus configuration furnishing an etching chamber and an ashing chamber in a vacuum transfer chamber (not shown), as a vacuum chamber, and also furnishing one cleaning process unit 14. A vacuum processing apparatus 1 is configured by two blocks: an atmospheric side block located in a front direction in FIG. 1 and mounted with cassettes; and a vacuum side block disposed with a first vacuum chamber 9-1 and a second vacuum chamber 9-2. The vacuum side block is configured by the first vacuum chamber 9-1 and second vacuum chamber 9-2 for processing wafers 2-1, 2-2, 2-3 in vacuum, a vacuum transfer robot, as a vacuum transfer mechanism 10, for carrying the wafer 2-1, 2-2 or 2-3 in or out with respect to the first vacuum chamber 9-1 and second vacuum chamber 9-2, and two load-lock chambers 11-1, 11-2 capable of changing over either an ambient atmosphere or a vacuum atmosphere so that the wafer 2-1, 2-2 or 2-3 is carried in or out with respect to the first vacuum chamber 9-1 and second vacuum chamber 9-2. The first vacuum chamber 9-1, as etching chamber, provides the wafer formed with either a single layer of the metallic film made up of either aluminum, nickel, chrome, tantalum, titanium, magnesium or lead, or a laminated film containing the metallic film to be supplied with a gas containing a corrosive gas ($Cl_2$, $BCl_3$, HCl, HBr, etc.) used for generating a plasma therein and to etch the film formed on the wafer along a mask pattern by the generated plasma. The second vacuum chamber 9-2, as the ashing chamber, introduces a gas ($O_2$, $H_2O$, $H_2$, $NH_3$, $CF_4$, etc.) used for generating the plasma to then perform an ashing process for a photoresist film, as a mask for an etching process of the film formed on the wafer, by the generated plasma,. Alternatively, for a purpose of inhibiting the corrosion, caused by a residue corrosive gas ($Cl_2$, $BCl_3$, HCl, HBr, etc.) in the etching process, of metallic film formed on the wafer, the second vacuum chamber 9-2 introduces the gas ($O_2$, $H_2O$, $H_2$, $NH_3$, $CF_4$, etc.) used for generating the plasma to then perform the ashing process by the generated plasma.

The atmospheric side block is configured by: a plurality of cassette mounting mechanisms 4-1, 4-2, 4-3 having an interface, at a front surface in FIG. 1, to make corresponded to setting the cassettes by a mapping mechanism and an operator for detecting an existence or nonexistence of the wafer or by a robot such as RGV (Rail Guided Vehicle); a first atmospheric transfer mechanism 6-1 as a first atmospheric transfer robot configured vertically movable so as to pick the wafer out from the cassette mounted on the cassette mounting mechanism 4-1, 4-2, 4-3; a transfer chamber having a substantially rectangular solid and having a space into which the wafer is transferred; the cleaning process unit 14 located on the right side surface of the substantially rectangular solid, for cleaning the wafer; a first wafer positioning mechanism 5-1 located on the left side of the cassette mounting mechanism 4-1, 4-2, 4-3, for positioning the wafer; and the load-lock chambers 11-1, 11-2 capable of changing over either the ambient atmosphere or the vacuum atmosphere.

Assuming that the lower direction of FIG. 1 is set to the front surface of cleaning process unit 14, the cleaning process unit 14 is configured by: a waiting stage 7, located on the front and left surface, on which the wafer, transferred from the first atmospheric transfer mechanism 6-1 in the atmospheric side block, is placed; a second atmospheric transfer mechanism 6-2 as a second atmospheric transfer robot configured vertically movable so as to pick the wafer placed on the waiting stage 7 out; a second wafer positioning mechanism 5-2 located on the front and right side surface in FIG. 1, for positioning the wafer; a cleaning process chamber 8 located on the posterior and right side surface in FIG. 1, for cleaning the wafer; and a heated-drying chamber 12 for drying the wafer, in heat, washed in the cleaning process chamber 8. The heated-drying chamber 12 may be of a spin drying system. The cleaning process chamber 8 removes a residual corrosive gas component by cleaning the wafer, with use of purified water or a drug solution, etched by the gas containing the corrosive gas ($Cl_2$, $BCl_3$, HCl, HBr, etc.) in the etching chamber. The heated-drying chamber 12 dries the wet wafer with the purified water by the heat.

In the lower and left side surface on FIG. 1 showing the vacuum processing apparatus 1 as a whole, a control console 13 (see also FIG. 2) is disposed as an interface with a man-machine interface (not shown) and a high-order host computer (not shown), and the first atmospheric transfer mechanism 6-1 and first wafer positioning mechanism 5-1 are also disposed in the rectangular solid-shaped transfer chamber at the central portion of that surface in FIG. 1. The first atmospheric transfer mechanism 6-1 extracts the wafer either at the cassette mounting mechanism 4-1, 4-2 or 4-3 or at between the cleaning process unit 14 located on the lower and right side surface on FIG. 1 and the first wafer positioning mechanism 5-1 or the load-lock chamber 11-1 or 11-2 which can be changed over. Further, a handle attached to the vacuum transfer mechanism 10 and the first and second atmospheric transfer mechanisms 6-1, 6-2 in the ambient atmosphere may be provided in plurality. The etching chamber and ashing chamber may also be provided in plurality in the vacuum chamber.

An operation in the embodiment of the invention will be described below. A first piece of the wafer 2-1, carried out from a cassette 3-1 by the first atmospheric transfer mechanism 6-1 provided under the ambient atmosphere, is transferred to the first vacuum chamber 9-1 via the load-lock chamber 11-1 or 11-2 and the vacuum transfer mechanism 10 through the first wafer positioning mechanism 5-1 to then be subjected to the etching process. When the operation in the process is performed continuously under the same processing condition (recipe), a subsequent second piece of the wafer 2-1 is transferred to the first vacuum chamber 9-1 likewise to the first piece of the wafer 2-1 so as to be able to continuously process it via the first wafer positioning mechanism 5-1, and the etching process then starts. The etching process-finished wafer 2-1 is transferred to the second vacuum chamber 9-2 via the vacuum transfer mechanism 10 to then be subjected to the ashing process. The ashing process-finished wafer 2-1 is transferred to the waiting stage 7 in the cleaning process unit 14 via the vacuum transfer mechanism 10, load-lock chamber 11-1 or 11-2 and first atmospheric transfer mechanism 6-1.

Thereafter, the wafer 2-1 is transferred to the cleaning process chamber 8 via the second wafer positioning mechanism 5-2 by the second atmospheric transfer mechanism 6-2 provided under the ambient atmosphere to then be subjected to the cleaning process. The cleaning process-finished wafer 2-1 is transferred to the heated-drying chamber 12 via the second atmospheric transfer mechanism 6-2 to be subjected to the drying process. The drying process-finished wafer 2-1 is put back to an initial cassette 3-1 (or 3-2 or 3-3) via the first atmospheric transfer mechanism 6-1.

Figure 3:
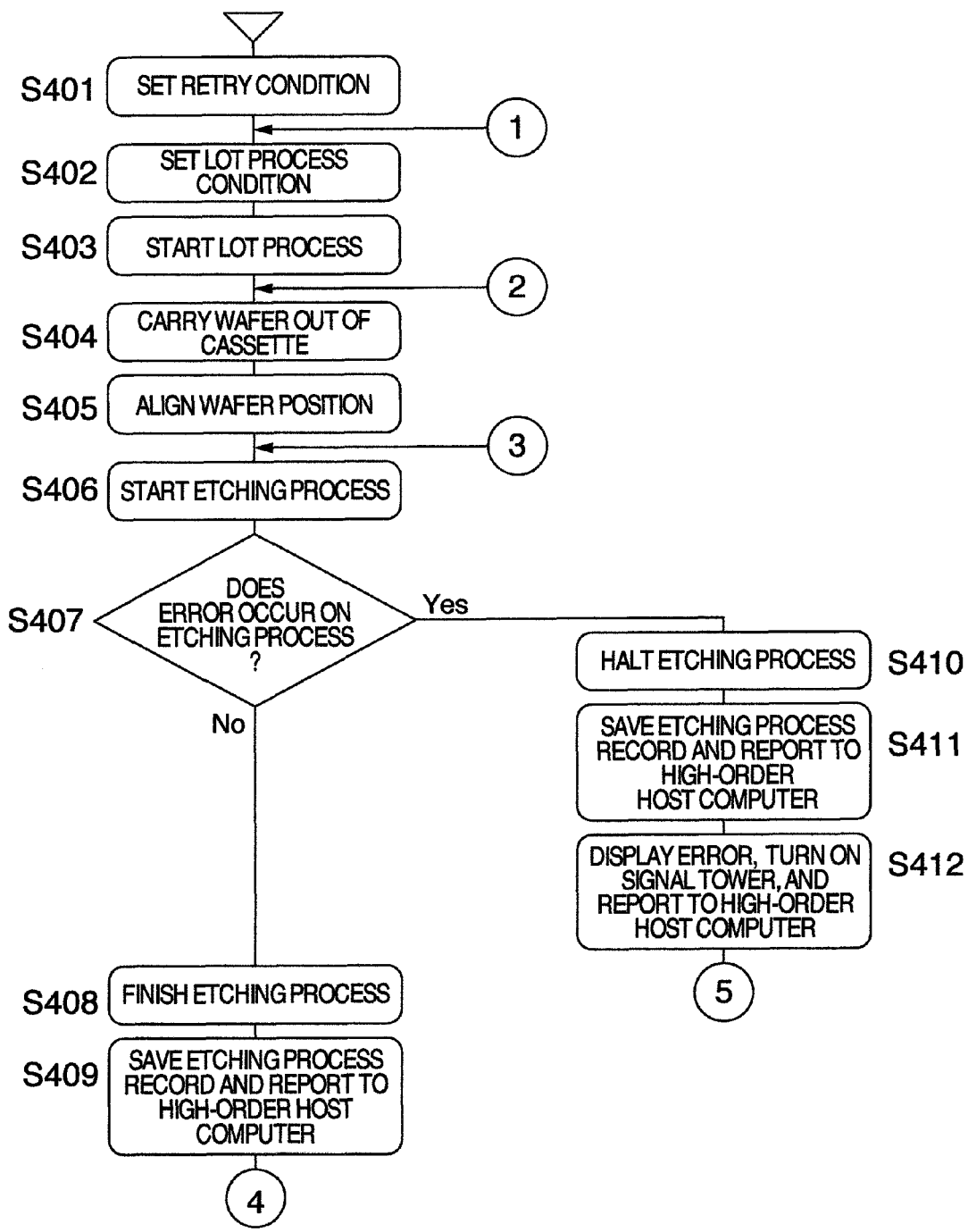
FIG. 3 is a flowchart showing a wafer process (etching process) in the embodiment of the invention.
Figure 4:
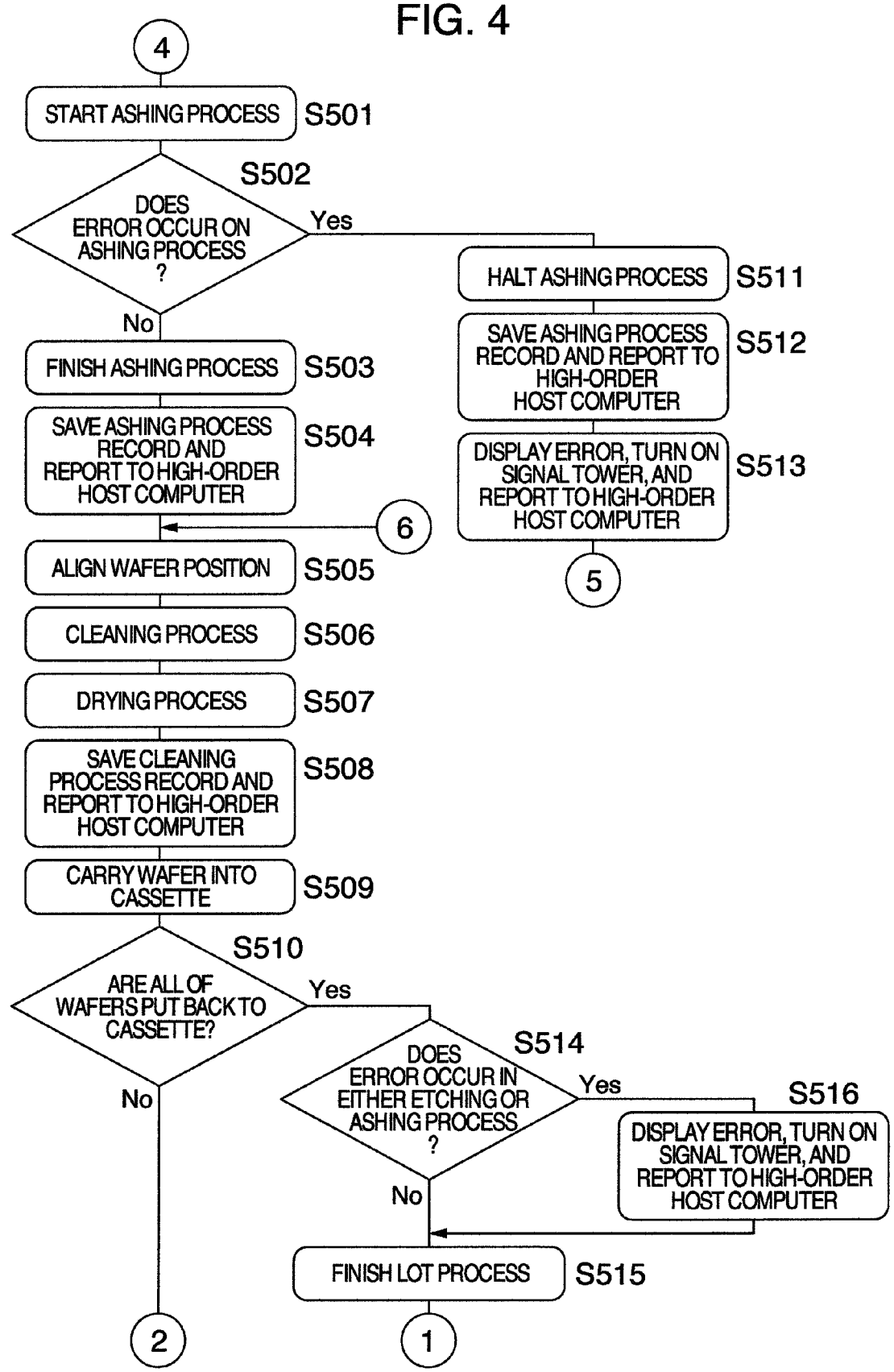
FIG. 4 is a flowchart showing the wafer process (ashing process and cleaning process) in the embodiment of the invention.
Figure 5:
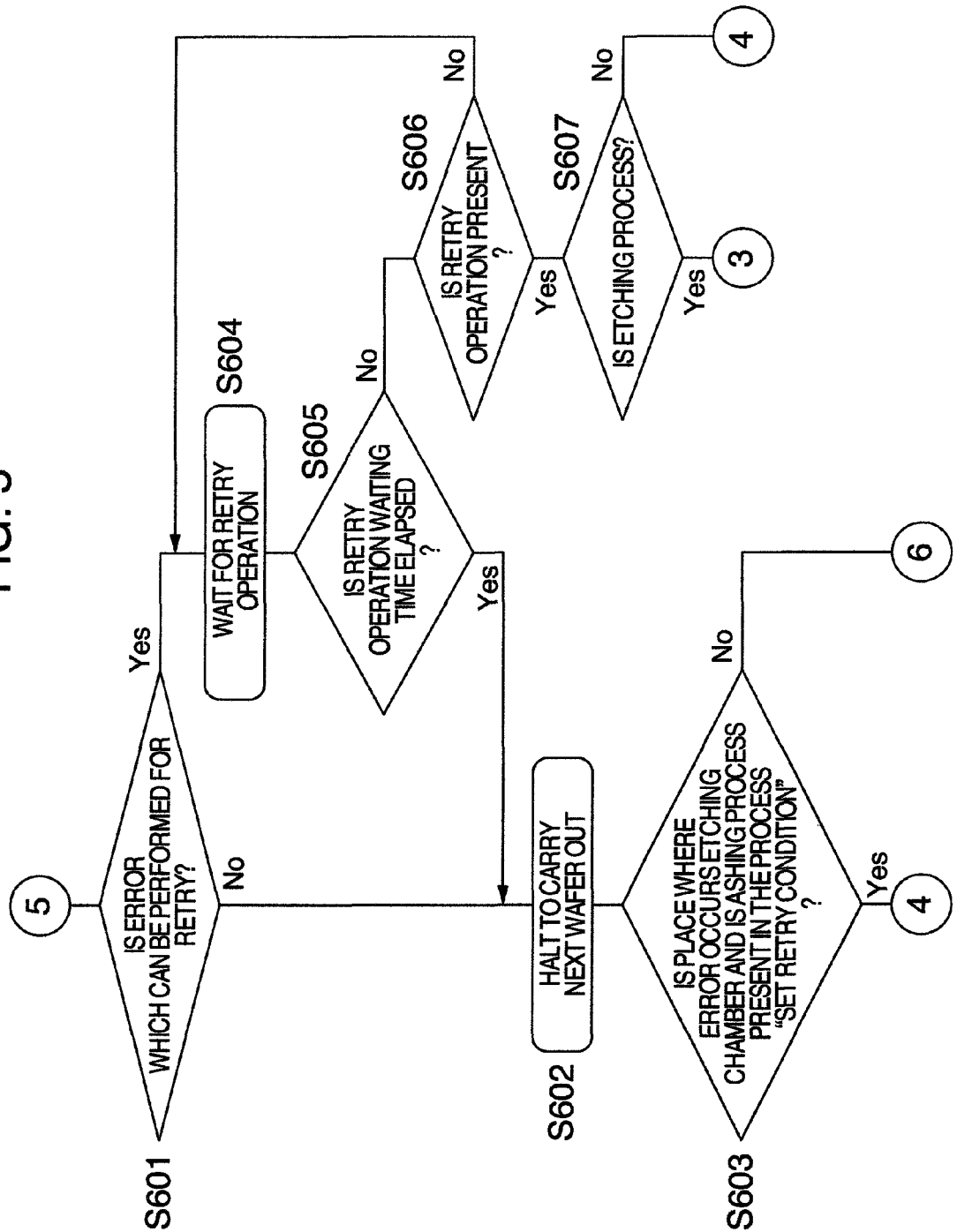
FIG. 5 is a flowchart showing an error process in the embodiment of the invention.

A processing sequence for a lot will be described with reference to FIG. 3, FIG. 4 and FIG. 5. Here, FIG. 3 is a flowchart showing a wafer process (etching process) in the embodiment of the invention. FIG. 4 is a flowchart showing a wafer process (ashing process and cleaning process) in the embodiment. FIG. 5 is a flowchart showing an error process in the embodiment. First, a retry condition in the recipe to be set as a lot process condition prior to entering a lot process is set by the operator or high-order host computer at a step S401. The recipe, as a processing condition of the first vacuum chamber 9-1 or second vacuum chamber 9-2, can be registered in plurality for every type of film (wafer) to be processed in the vacuum chamber. Further, a setting and a change for the recipe, other than the recipe on process in the vacuum chamber, can be allowed by the operator or high-order host computer as needed.

The retry operation means a restart operation for the wafer process after an abnormality (error) occurred at a time during which the wafer is processed in either the first vacuum chamber 9-1 or the second vacuum chamber 9-2. There are four types of retry operation as shown in Table 1: first, a restart operation for remaining processes from a condition where the abnormality (error) occurs; second, a restart operation for the processes by changing the processing condition (recipe) for the wafer on which the abnormality (error) occurs; third, a restart operation for which the process in the chamber where the abnormality occurs is aborted to then process the wafer by a next chamber; and fourth, a restart operation for which the lot (wafer) process is aborted to then process the wafer next. The operator or high-order host computer therefore selects an appropriate retry operation in response to the abnormality (error) occurred and a recoverable condition in the vacuum processing apparatus 1.

TABLE 1

| Retry operation name | Retry contents |
| --- | --- |
| Duration | Remaining processes are restarted from condition where error occurs. |
| Change of processing condition | Processing condition (recipe) is changed for wafer on which error occurs, and process is restarted. |
| Processing skip | Process in chamber in which error occurs is aborted to then process wafer in next chamber. |
| Aborting | Lot (wafer) process is aborted. |

The process "set retry condition" at the step S401 means that a retry operation waiting time and an existence or nonexistence for the ashing process are set as indicated in Table 2. The retry operation waiting time can be indicated by minutes or by zero to N minutes. N minutes means a time for specifying a transfer start of the wafer in consideration of a time until the corrosion of metallic film formed on the wafer begins to occur from a condition where the etching processed wafer is not subjected to the ashing process or the cleaning process. Possibly, the time may be a time subtracted a wafer transfer time from the time at which the corrosion begins to occur. When a zero minute is set as the retry operation waiting time, it is assumed that the waiting for the retry operation is not performed. When a time other than the zero minute is set, the retry operation to be instructed from the operator or high-order host computer waits for until the setting time is elapsed.

The existence or nonexistence of the ashing process determines that whether the ashing process is performed or not for the wafer on which the error occurs in the etching chamber, in the case where the ashing process is performed for the corrosion prevention or corrosion inhibition. If the ashing process is set as existence, the cleaning process is applied to the wafer, after the ashing process, to then be put back to the cassette. If the ashing process is set as nonexistence, the cleaning process is only applied to the wafer to be put back to the cassette without performing the ashing process. The retry condition may be set not only by the recipe but also by a system parameter of the vacuum processing apparatus.

TABLE 2

| Recipe item | Contents |
| --- | --- |
| Retry operation waiting time | Time feasible for retry operation from operator or high-order host computer is set from after occurring abnormality for which retry can be performed. |
| Existence or nonexistence of ashing process | Whether ashing process is performed or not is set for wafer on which error occurs in etching chamber. |

Figure 2:
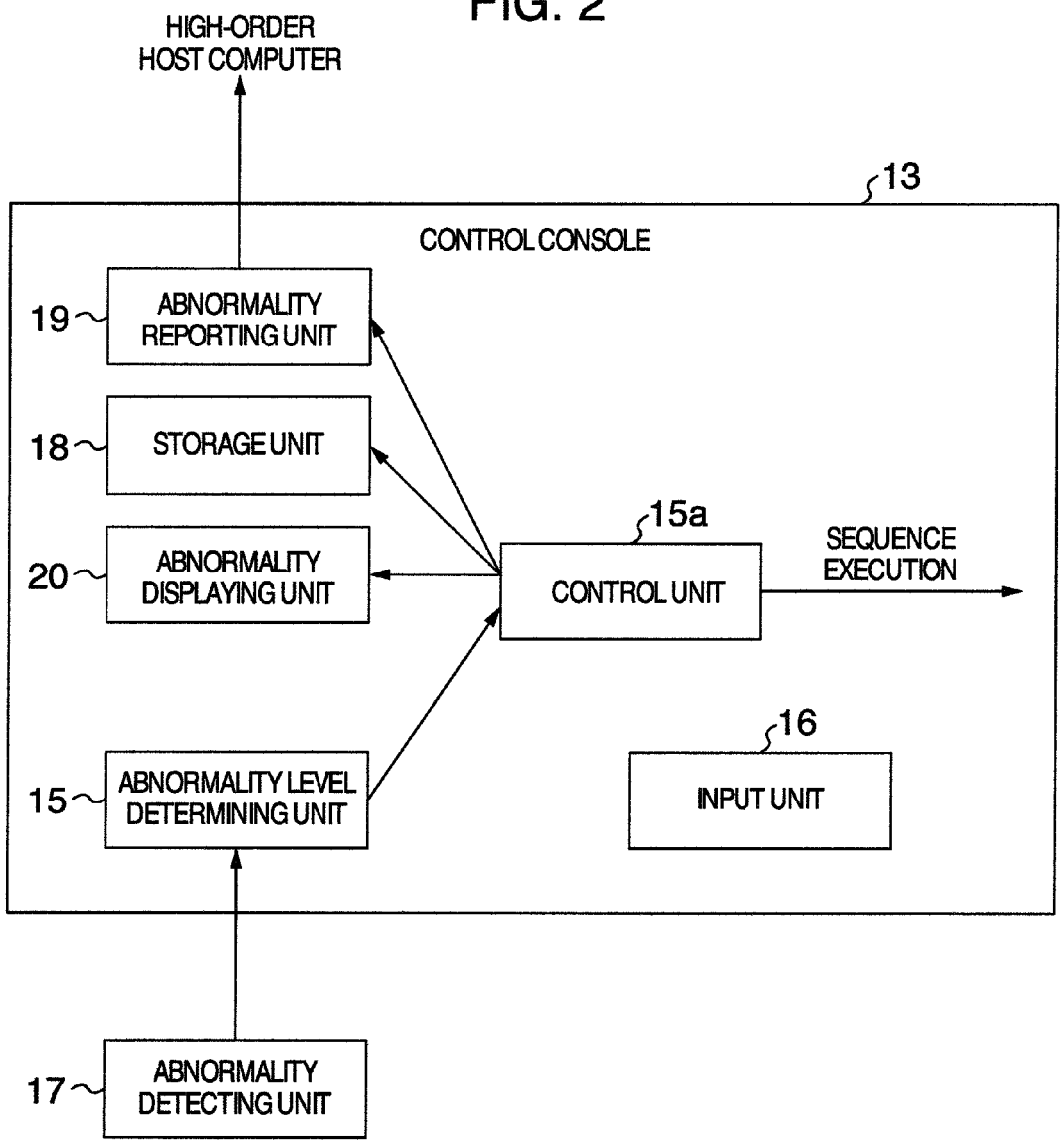
FIG. 2 is a block diagram showing a control console etc. in the embodiment of the invention.

The retry operation waiting time, the existence or nonexistence of ashing process and the lot process condition (at a step S402), are set by an input unit 16 provided in a control console 13 in FIG. 2 in response to an instruction from the operator or high-order host computer to then start the lot (wafer) process under the lot process condition, at a step S403. The process "set the lot process condition" at the step S402 sets the etching process for processing every wafer, the condition (recipe) of the ashing or cleaning process, and the number of wafers to be processed.

Next, one piece of wafer is extracted from the cassette at a step S404, and a wafer positioning is performed by the first wafer positioning mechanism 5-1 at a step S405. Subsequently, the wafer is subjected to the etching process in the first vacuum chamber 9-1 through the load-lock chamber 11-1 or 11-2 at steps S406, S407, S408, S409. Thereafter, the wafer is subjected to the ashing process in the second vacuum chamber 9-2 at steps S501, S502, S503, S504, as shown in FIG. 4. The wafer is then transferred to the cleaning process unit 14 through the load-lock chamber 11-1 or 11-2 to be subjected to a wafer positioning by the second wafer positioning mechanism 5-2 at a step S505. Thereafter, the wafer is subjected to the cleaning process in the cleaning chamber 8 at a step S506. The drying process is applied to the wafer in the heated-drying chamber 12 at a step S507 to then put back to the initial cassette 3-1, 3-2 or 3-3. The wafer subjected to the drying process at the step 507 may be put back to another cassette 3-1, 3-2 or 3-3. When the first wafer is transferred to the load-lock chamber 11-1 or 11-2, a next wafer is carried out from the cassette 3-1, 3-2 or 3-3 to be subjected to the wafer process at the steps S404 to S409 and the steps S501 to S509. The lot process repeats until whether the wafer process is completed for all of the wafers in the cassettes 3-1, 3-2 and 3-3 or for the pieces of wafer indicated by the process "set the lot process condition" at the step S402.

On the lot process as described above, there are two conditions where, first, the wafer can be processed normally by the first and second vacuum chambers 9-1, 9-2, and second, the etching or ashing process cannot be continued by occurring the abnormality (error) on the wafer process in the first vacuum chamber 9-1 or second vacuum chamber 9-2. In addition, the detection of abnormality (error) is performed by an abnormality detecting unit 17 in FIG. 2. Hereinafter, an operation sequence on the occurrence of abnormality will be described with reference to the control console 13 in FIG. 2.

When the abnormality detecting unit 17 detects an abnormality on the wafer process in the first vacuum chamber 9-1 or the second vacuum chamber 9-2 (S407, S502), the etching or the ashing process is halted (S410, S511). An etching process record or ashing process record is then saved in a storage unit 18, and the process record is also reported to the high-order host computer by an abnormality reporting unit 19 (S411, S512). Thereafter, the abnormality occurrence is displayed by an abnormality displaying unit 20, for example, the abnormality is displayed by turning on a signal tower, and a voice or light is indicated to the operator by the abnormality reporting unit 19, further, a signal indicating the abnormality occurrence is also sent to the high-order host computer (S412, S513). Next, an abnormality level determining unit 15 determines whether the occurred abnormality is a serious abnormality (which is abnormality and impossible to retry) or a light abnormality (which is abnormality but possible to retry) at a step S601 in FIG. 5. The serious abnormality (which is abnormality and impossible to retry) means an abnormality which cannot be performed for an immediate recovery, including a failure of a plasma generation high frequency power source (not shown) for the first vacuum chamber 9-1 or second vacuum chamber 9-2, a failure of a wafer bias high frequency power source (not shown) in the vacuum chamber, a component breakage in the vacuum chamber, etc. Here, the wafer bias high frequency power source means a high frequency power source to be applied to an electrode (not shown) on which the wafer is placed in the vacuum chamber. Further, the light abnormality (which is abnormality but possible to retry) means a minor abnormality which can be performed for the immediate recovery from a process gas flow shortage caused by skipping a gas valve open in the first vacuum chamber 9-1 or second vacuum chamber 9-2, by a pressure variation caused by a noise in the vacuum chamber, by a failure which cannot be performed for a detection of igniting the plasma, etc.

When an abnormality level determining unit 15 determines that the occurred abnormality is an abnormality which cannot be performed for the retry, the wafer transfer is halted at a step S602. Thereafter, the process determines whether a place where the abnormality occurs is the etching or the ashing process exists in the process "set retry condition" at the step S401, at a step S603. When the place where the abnormality occurred is the etching chamber and the existence of ashing process is set in the process "set retry condition" at the step S401, the wafer is subjected to the ashing process at the steps S501 to S504 without instructing from the operator or the high-order host computer. Thereafter, the wafer is transferred to the cleaning process unit 14 to be subjected to the cleaning process at the step S506 and the drying process at the step S507, so that the metallic film formed on the wafer can be prevented and inhibited from the corrosion caused by the corrosive gas ($Cl_2$, $BCl_3$, HCl, HBr, etc.). Further, when a place where the abnormality occurred is the etching chamber and the nonexistence of ashing process is set in the process "set retry condition" at the step S401 and the place where the error occurs is neither the etching chamber nor ashing chamber, the wafer is transferred to the cleaning process unit 14 without instructing from the operator or the high-order host computer to then be subjected to the cleaning process at the step S506 and the drying process at the step S507, so that the metallic film formed on the wafer can be prevented and inhibited from the corrosion caused by the chlorine gas etc. In addition, on the occurrence of abnormality, the wafer processed in the first vacuum chamber 9-1 or the second vacuum chamber 9-2 in which the abnormality does not occur is transferred to the cleaning process unit 14, after completing the process in the first or second vacuum chamber 9-1 or 9-2, among the wafers already carried out from the cassette. The wafer is subjected to the cleaning process at the step S506 and the drying process at the step S507 to then be transferred to the initial cassette or another one. Further, on the occurrence of abnormality, since the wafer placed in the first wafer positioning mechanism 5-1 or the load-lock chamber 11-1 or 11-2 has not been transferred to the first vacuum chamber 9-1, the wafer is not subjected to the cleaning process unit 14 to be put back to the initial cassette or another one due to no danger for the corrosion occurrence of the metallic film formed on the wafer. Thereafter, when all of the wafers are put back to the cassettes at a step S510 or a step S514, the error is displayed and the signal tower is turned on by the abnormality displaying unit 20. The abnormality occurrence is also reported to the operator and the high-order host computer by the abnormality reporting unit 19 at a step S516, and the lot process is then completed at a step S515.

When the abnormality occurred is determined as the abnormality which can be performed for the retry by the abnormality determining unit 15, the vacuum processing apparatus waits for an instruction from the operator or the high-order host computer at steps S604, S605, S606 until a retry waiting time set as the recipe in advance. When the retry operation is performed by the operation of operator or the instruction from the high-order host computer within a setting time of the retry waiting time at the step S606 and a step S607, the etching or ashing process is restated and the wafer carrying-in for a next wafer is also restarted. Likewise to the normally processed sequence, the predetermined setting wafer is processed.

However, when the retry operation is not performed, at the step S605, by the operation of operator or the instruction from the high-order host computer within the setting time of the retry waiting time set in the process "set retry condition" at the step S401, the wafer carrying-out for the next wafer is halted at the step S602. Thereafter, when a place where the abnormality occurs is the etching chamber and the existence of the ashing process is set in the process "set retry condition" at the step S401, the ashing process is performed at the steps S501 to S504 without indication from the operator or the high-order host computer. Thereafter, the wafer is transferred to the cleaning process unit 14 to be subjected to the cleaning process at the step S506 and the drying process at the step S507, so that the metallic film formed on the wafer can be prevented and inhibited from the corrosion caused by the corrosive gas ($Cl_2$, $BCl_3$, HCl, HBr, etc.). Further, when a place where the abnormality occurs is the etching chamber and the nonexistence of ashing process is set in the process "set retry condition" at the step S401 and the place where the abnormality occurs is not the etching or ashing chamber, the wafer is transferred to the cleaning process unit 14 without the operation of operator or instruction from the high-order host computer to be subjected to the cleaning process at the step S506 and the drying process at the step S507, so that the metallic film formed on the wafer can be prevented and inhibited from the corrosion caused by the corrosive gas ($Cl_2$, $BCl_3$, HCl, HBr, etc.). In addition, on the abnormality occurrence, the wafer processed in the first vacuum chamber 9-1 or the second vacuum chamber 9-2 in which the abnormality does not occur is transferred to the cleaning process unit 14, after completing the process in the first or second vacuum chamber 9-1 or 9-2, among the wafers already transferred out from the cassette. The wafer is then subjected to the cleaning process at the step S506 and the drying process at the step S507 to be put back to the initial cassette or another one. Further, on the abnormality occurrence, since the wafer placed in the first wafer positioning mechanism 5-1 or the load-lock chamber 11-1 or 11-2 has not been transferred to the first vacuum chamber 9-1 as the etching chamber, the wafer is not subjected to the cleaning process unit 14 to be put back to the initial cassette or another one due to no danger for the corrosion occurrence of the metallic film formed on the wafer. Thereafter, when all of the wafers are put back to the cassettes at the step S510 or the step S514, the abnormality is displayed by the abnormality displaying unit 20, for example, the signal tower is turned on. The abnormality occurrence is also reported to the operator and the high-order host computer by the abnormality reporting unit 19 at the step S516, and the lot process is completed at the step S515.

An operation sequence on the abnormality occurrence is performed by a control unit 15a incorporated in the control console 13 of the vacuum processing apparatus 1.

In the past, the wafer on being processed has often been left for a long period of time when there is no operation instructed from the operator or high-order host computer when occurring the abnormality, therefore, there has been a danger of the corrosion, for the metallic film formed on the wafer, caused by leaving the wafer for the long period of time. However, the cleaning process is subjected to automatically (or forcibly) without operation instructed from the operator or the high-order host computer, so that the metallic film formed on the wafer can be prevented and inhibited from the corrosion caused by the corrosive gas ($Cl_2$, $BCl_3$, HCl, HBr, etc.).

Further, after performing the cleaning process automatically, the abnormality reporting unit 19 reports the error to the operator and/or the high-order host computer at the step S516, so that the operator and/or the high-order host computer can discriminate an abnormality lot (or wafer). The operator and/or the high-order host computer can refer to wafer process recording information (a processing state of the etching process at the steps S409, S411, the ashing process at the steps S504, S512 or the cleaning process at the step S508 is stored for every wafer) stored in the storage unit 18 or the wafer process recording information, at the steps S409, S411, S504, S512 and S508, reported to the high-order host computer, so that it can be determined that whether the etching or ashing process is required as additional one and it is possible to recover a disposable wafer by performing to restart the lot process.

In addition, the retry operation waiting time of the process "set retry condition" at the step S401 can be set for every abnormality, since the time until the metallic film formed on the wafer is corroded varies, depending on the abnormality occurred at a time before starting the etching or ashing process, occurred at a time on the etching or ashing process, or occurred at a time immediately before finishing the etching or ashing process, in response to matter of the occurred abnormality. Alternatively, a single retry operation waiting time may be set for every abnormality.

The invention is not limited to the abnormality occurred in the etching chamber or ashing chamber. When the error occurs in the load-lock chamber 11-1 or 11-2, the wafer in the etching chamber and subsequent wafers are normally subjected to the ashing process, cleaning process and drying process to then be put back to the initial cassette or another one. The wafer in the load-lock chamber 11-1 or 11-2 can be transferred, and the wafer is put back to the initial cassette or another one without subjecting the cleaning process and drying process if the wafer is not transferred to the first vacuum chamber 9-1. The wafer is subjected to the cleaning process and drying process to be put back to the initial cassette or another one if the wafer is transferred to first vacuum chamber 9-1.

Further, in the case where one load-lock chamber 11-1 or 11-2 is used for carrying the wafer exclusively in the vacuum transfer chamber and the other load-lock chamber 11-1 or 11-2 is used for carrying it exclusively out from the vacuum transfer chamber, the transfer to the cleaning process chamber 8 cannot be performed when the abnormality occurs in the load-lock chamber 11-1 or 11-2. In consequence, the metallic film formed on the wafer cannot be prevented or inhibited from the corrosion. In a countermeasure against the corrosion, the wafer in the ashing chamber is saved once to the load-lock chamber 11-1 or 11-2 into which it is exclusively carried, after finishing the ashing process, and the wafer in the etching chamber is transferred to the ashing chamber, after finishing the etching process, to perform the ashing process, so that the metallic film formed on the wafer can be prevented and inhibited from the corrosion.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A vacuum processing apparatus including a vacuum chamber for subjecting a wafer on which a single layer or a laminated film containing a metallic film is formed to a plasma process by using a corrosive gas, and a wet cleaning process unit for removing a residual corrosive gas component of the wafer subjected to the plasma process, comprising:
   a control unit configured to perform a sequence to abort the plasma process of the wafer when an abnormality occurs in the vacuum chamber, then
   (1) to perform a restart operation of the plasma process for the wafer subjected to the aborting of the plasma process according to an instruction from an operator or a host computer when a period between a time of the aborting of the plasma process of the wafer and a time of the performing of the restart operation of the plasma process for the wafer subjected to the aborting of the plasma process is less than a predetermined time period; or
   (2) when the restart operation is not performed or not successfully performed by an end of the predetermined time period, to perform transfer of the wafer subjected to the aborting of the plasma process to the wet cleaning process unit for removing the residual corrosive gas component of the wafer when the end of the predetermined time period between the time of the aborting of the plasma process of the wafer and the time of the performing of the restart operation of the plasma process for the wafer subjected to the aborting of the plasma process has been attained;
   wherein a length of the predetermined time period is a length of time required for preventing corrosion of the wafer subjected to the aborting of the plasma process.

2. The apparatus according to claim 1, wherein the control unit is configured so that the restart operation includes an operation for restarting a remaining portion of the plasma process of the wafer which was aborted from a condition where the plasma process of the wafer is aborted when the abnormality occurs.

3. The apparatus according to claim 1, wherein the control unit includes a detector which determines occurrence of the abnormality and an abnormality level detecting unit which determines whether the abnormality detected is subject to the restart operation, the control unit enabling performance of the restart operation in response to the abnormality level detecting unit detecting that the abnormality which occurred is subject to the restart operation.

4. The apparatus according to claim 2 further comprising an abnormality reporting unit that reports, to the operator or the host computer, that a plurality of wafers are processed abnormally.

5. A vacuum processing method of applying a plasma process to a wafer on which a single layer or a laminated film containing a metallic film is formed by using a corrosive gas in a vacuum processing apparatus including a vacuum chamber for subjecting the wafer to the plasma process, and a wet cleaning process unit for removing a residual corrosive gas component of the wafer subjected to the plasma process, comprising the steps of:

aborting the plasma process of the wafer when an abnormality occurs in the vacuum chamber;

(1) then performing a restart operation of the plasma process for the wafer subjected to the aborting of the plasma process according to an instruction from an operator or a host computer when a period between a time of the aborting of the plasma process of the wafer and a time of the performing of the restart operation of the plasma process for the wafer subjected to the aborting of the plasma process from the operator or the host computer is less than a predetermined time period; or (2) when the restart operation is not performed or not successfully performed by an end of the predetermined time period, transferring the wafer subjected to the aborting of the plasma process to the wet cleaning process unit for removing the residual corrosive gas component of the wafer when the end of the predetermined time period between the time of the aborting of the plasma process of the wafer and the time of the performing of the restart operation of the plasma process for the wafer subjected to the aborting of the plasma process from the operator or the host computer has been attained;

wherein a length of the predetermined time period is a length of time required for preventing corrosion of the wafer subjected to the aborting of the plasma process.

6. The method according to claim 5, wherein the control unit includes a detector which determines occurrence of the abnormality and an abnormality level detecting unit which determines whether the abnormality detected is subject to the restart operation, the control unit enabling performance of the restart operation in response to the abnormality level detecting unit detecting that the abnormality which occurred is subject to the restart operation.

* * * * *